United States Patent [19]

Cleveland et al.

[11] Patent Number: 5,407,622
[45] Date of Patent: Apr. 18, 1995

[54] PROCESS FOR MAKING METALLIZED PLASTIC ARTICLES

[75] Inventors: Eric J. Cleveland, Homer; David C. Frisch, Fairport, both of N.Y.; Wilhelm Weber, Newcastle, Del.

[73] Assignees: Smith Corona Corporation, New Canaan; Kollmorgen Corporation, Simsbury, both of Conn.

[21] Appl. No.: 88,909

[22] Filed: Jul. 8, 1993

Related U.S. Application Data

[63] Continuation of Ser. No. 76,138, Jul. 21, 1987, abandoned, which is a continuation of Ser. No. 897,291, Aug. 15, 1986, abandoned, which is a continuation-in-part of Ser. No. 704,440, Feb. 22, 1985, abandoned.

[51] Int. Cl.$^6$ .............................................. B29C 45/00
[52] U.S. Cl. .................................... 264/104; 156/150; 264/259; 264/328.1
[58] Field of Search ............ 264/104, 105, 259, 328.1; 156/150

[56] References Cited

U.S. PATENT DOCUMENTS

| | | |
|---|---|---|
| 2,982,045 | 9/1976 | Kukanskis . |
| 3,546,009 | 1/1967 | Schneble et al. . |
| 3,560,257 | 2/1971 | Schneble et al. . |
| 3,600,330 | 8/1971 | Schneble et al. . |
| 3,629,185 | 12/1971 | Schneble et al. . |
| 3,640,789 | 2/1972 | Hepfer ................................. 156/92 |
| 3,865,623 | 2/1975 | Allen, Jr. et al. . |
| 3,993,802 | 11/1976 | Polichette et al. .................. 427/98 |
| 4,305,975 | 12/1981 | Ikari et al. . |
| 4,402,135 | 9/1983 | Schweingruber ................ 264/104 |
| 4,424,095 | 1/1984 | Frisch et al. ..................... 156/629 |
| 4,442,055 | 4/1984 | Oelsch ............................. 264/105 |
| 4,450,190 | 5/1984 | Nuzzi ............................. 427/304 |
| 4,460,534 | 7/1984 | Boehm et al. .................... 264/250 |

FOREIGN PATENT DOCUMENTS

| | | |
|---|---|---|
| 0132485 | 2/1985 | European Pat. Off. . |
| 11731 | 6/1956 | Germany . |
| 2207511 | 9/1973 | Germany . |
| 2305883 | 8/1974 | Germany . |
| 3047287 | 9/1981 | Germany . |
| 145866 | 12/1976 | Japan . |
| 145886 | 12/1976 | Japan . |
| 79474 | 6/1979 | Japan . |
| 7897 | 1/1983 | Japan . |
| 93890 | 6/1983 | Japan . |
| 77281 | 10/1983 | Japan . |
| 39069 | 10/1988 | Japan . |
| 607546 | 12/1978 | Switzerland . |
| 1254308 | 11/1971 | United Kingdom . |
| 1426629 | 3/1976 | United Kingdom . |
| 1499381 | 2/1978 | United Kingdom . |

OTHER PUBLICATIONS

*Arburg Heute*, vol. 5, No. 9, pp. 32-37 (Dec. 1974) (Customer newsletter of Arburg Maschinefabrik Hehl & Sohne).

Primary Examiner—James Derrington
Attorney, Agent, or Firm—Morgan & Finnegan

[57] ABSTRACT

Molded, one-piece articles having selected surfaces suitable for adherent metallization, molded, metallized, one-piece articles and processes for making the articles are disclosed. The molded one-piece articles may be formed by: molding into a first mold cavity a first portion of the article using a first electrically insulating material which is capable of adhesion promotion by an adhesion promotion process and is catalytic for adherent metallization or is capable of being rendered catalytic for adherent metallization by an activating process; inserting the first portion into a second mold cavity; and molding into the second mold cavity a second portion of the article using a second electrically insulating material, leaving selected surfaces of the first portion exposed. The second material is resistant to the adhesion promotion process employed for the first material, or is non-catalytic for, and incapable of being rendered catalytic for, adherent metallization by the activating process employed for the first material. The exposed surfaces of the first portion of the article then may be metallized, for example, by electroless deposition to form the metallized one-piece article.

10 Claims, 5 Drawing Sheets

PROCESS FOR MAKING METALLIZED PLASTIC ARTICLES

CROSS REFERENCE TO RELATED APPLICATIONS

This is a continuation of application Ser. No. 07/076,138, filed on Jul. 21, 1987, now abandoned which is a continuation of Ser. No. 06/897,291filed on Aug. 15, 1986, now abandoned which is a continuation in part of Ser. No. 06/704,440filed on Feb. 22, 1985 now abandoned.

BACKGROUND OF THE INVENTION

This invention relates to molded one-piece articles having selected surfaces suitable for adherent metallization or molded metallized articles and processes for forming the articles. More particularly, this invention relates to molded, one-piece blanks for printed circuit boards and molded one-piece articles, such as printed circuit boards; molded, metallized, one-piece articles, such as printed wiring boards; and processes for forming the blanks and metallized articles which include two separate molding steps to form portions of the articles.

U.S. Pat. No. 3,629,185 to F. W. Schneble, Jr. et al describes a process for forming a metallized article, such as a printed circuit board, having an insulating substrate as a base material. The process uses a plastic substrate filled with a powder catalyst which promotes metal deposition in a subsequent electroless metal plating step. The process also includes using a direct or reverse printing technique for preparing specific surface areas of the substrate to form the printed circuit for metallization. When high quantity production is needed, the printing step becomes costly.

U.S. Pat. No. 4,402,135 to Schweingruber et al describes a process for forming printed circuit boards which employs two separate injection molding steps to form a circuit pattern on a support board. In the first step, an electrically insulating plastic material for the substrate is injection molded. In the second step, an electrically conductive plastic material is injection molded. The electrically conductive plastic material is electroplated with metal to form electrically conductive paths. A disadvantage of the method is that an excessive number of gates are required in the second cavity mold to fill several channels on the upper and lower surfaces of the support member to provide a circuit pattern with several electrically conductive paths. Another disadvantage of this method is that the electrically conductive plastic strips may separate or peel off from the support member due to a lack of a rigid connecting structure between the several plastic strips, particularly between the plastic strips on the upper and lower surfaces of the support member. When using a conductive plastic as Schweingruber does, the circuit pattern cannot be molded with a web between conductors in the first molding step, or first shot, because all conductors would short circuit together.

SUMMARY OF THE INVENTION

OBJECTS OF THE INVENTION

Accordingly, an object of this invention is to form a molded article for adherent metallization, such as a printed circuit board with a circuit pattern, by a process which eliminates the costly steps necessary to select surfaces for metallizing such as direct or reverse printing technique, lithographing, silk screening, and the like.

Another object of this invention is to form a molded article for adherent metallization, such as a printed circuit board which includes the circuit pattern, by a two shot injection molding process. The first shot forms the circuit pattern and the second shot forms a support structure around the circuit pattern.

A further object of this invention is to form a molded article for adherent metallization, such as a printed circuit board with a circuit pattern, by forming a first electrically insulating material into a first predetermined shape and by molding a second electrically insulating material into a second predetermined shape which includes interconnecting the second predetermined shape with the first predetermined shape to produce a one-piece article.

Another object of this invention is to form a molded article for adherent metallization, such as a printed circuit board, by an additive process using a minimum number of steps.

A further object of this invention is to form a molded article for adherent metallization, such as a printed circuit board, which has additional integrally molded structure for mounting or attaching to non-electrical components.

Another object of this invention is to form a molded article for adherent metallization, such as a printed circuit board, by a manufacturing process capable of efficiently and economically producing large quantities.

A further object of this invention is to form a molded article for adherent metallization, such as a printed circuit board, economically by using various molding processes such as injection, compression, extrusion, casting and others.

Another object of this invention is to form a molded article for adherent metallization, such as a printed circuit board, economically by using various materials such as thermoplastic resins, thermoset resins, ceramics, glass, and the like.

A further object of this invention is to mold an article by an alternate two shot injection molding process. The first shot of this alternate process forms a first predetermined shape of the article using a first electrically insulating material selected to avoid metal adherence. The second shot of this alternate process form a second predetermined shape of the article using a second electrically insulating material catalyzed for metal adherence.

Molded printed circuits with three dimensional surface features and non-planar molded circuits with non-planar conductor patterns are among the metallized polymer articles that may be produced by this invention.

Other objects, features, and advantages of the invention will become more apparent from the following description, including appended claims and accompanying drawing.

BRIEF DESCRIPTION OF THE INVENTION

In one aspect, the invention comprises a process for the production of a one-piece, non-conductive article. The process comprises the steps of (a) molding a first electrically insulating material into at least one first predetermined shape, the first material being (i) resistant to adhesion by an adhesion promotion process or (ii) non-catalytic for, and incapable of being rendered catalytic for, adherent metallization by an activating process; (b) forming a second electrically insulating material into at least one second predetermined shape, the second material being capable of adhesion promotion by an adhesion promotion process and (i) catalytic for adherent metallization or (ii) capable of being rendered catalytic for adherent metallization by an activating process; and interconnecting the first and second shapes to produce the one-piece, non-conductive article wherein selected surface areas of the article are suitable for adherent metallization and remaining areas defined by the first shape are resistant to adherent metallization.

In another aspect, the invention comprises a second process for the production of a one-piece, non-conductive article wherein the process comprises the steps of forming a first electrically insulating material into at least one first predetermined shape, the first material being capable of adhesion promotion by an adhesion promotion process and (i) catalytic for adherent metallization or (ii) capable of being rendered catalytic for adherent metallization by an activating process; molding a second insulating material into at least one second predetermined shape the second material being (i) resistant to the adhesion promotion process employed for the first material or (ii) non-catalytic for, and incapable of being rendered catalytic for, adherent metallization by the activating process employed for said first material; and interconnecting the first and second shapes to produce the one-piece, non-conductive article wherein selected surface areas of the article defined by the first shape(s) are suitable for adherent metallization and remaining areas defined by the second shape(s) are resistant to adherent metallization.

In yet another aspect, the invention concerns a process for the production of a one-piece, non-conductive article having a metallized pattern on its surface comprising the steps of forming a first electrically insulating material into at least one first predetermined shape, the first material being capable of adhesion promotion by an adhesion process and (i) catalytic for adherent metallization or (ii) capable of being rendered catalytic for adherent metallization by an activating process; molding a second electrically insulating material into at least one second predetermined shape the second material being (i) resistant to the adhesion promotion process employed for the first material or (ii) non-catalytic for and incapable of being rendered catalytic for adherent metallization by the activating process employed for the first material; interconnecting the first and second shapes to produce the one-piece, non-conductive article wherein selected surface areas of the article defined by the first shape(s) are suitable for adherent metallization and remaining areas defined by the second shape(s) being resistant to adherent metallization; adhesion promoting the first material in the selected surface areas defined by the first shape and optionally activating the first material for metal deposition; and depositing metal on the selected surface areas of the first shape to form the metallized pattern.

In yet another aspect, the invention also includes a process for the production of a printed circuit board comprising the steps of forming a circuit pattern from a first electrically insulating material, the first material being capable of adhesion promotion by an adhesion promotion process and (i) catalytic for adherent metallization or (ii) capable of being rendered catalytic for adherent metallization by an activating process; molding a support structure from a second electrically insulating material onto the circuit pattern, the second material being (i) resistant to the adhesion promotion process employed for the first material or (ii) non-catalytic for, and incapable of being rendered catalytic for adherent metallization by the activating process employed for the first material, the support structure leaving exposed selected surface areas of the circuit pattern; and metallizing the selected surface areas defined by the circuit pattern to form at least one electrically conductive path.

An article is formed by a molding process, the article having a pattern suitable for adherent metallization. The article is formed by shaping two different electrically insulating materials and combining them together in one unitary shaped article.

A first shape is comprised of a first electrically insulating material capable of adhesion promotion by an adhesion promotion process and (i) catalytic for adherent metallization or (ii) capable of being rendered catalytic for adherent metallization by an activating process.

A second shape is comprised of a second electrically insulating material (i) resistant to the adhesion promotion process employed for said first material or (ii) non-catalytic for, and incapable of being rendered catalytic for adherent metallization by the activating process employed for the first material. The first and second materials define first and second patterns on a surface of the molded article, the first pattern being suitable for adherent metallization and the second pattern being resistant to it.

In another aspect of the invention, the second shape is comprised of an electrically insulating material which may comprise a similar or even the same polymer as the first material, but is non-catalytic for adherent metallization and is capable of being rendered resistant to adherent metallization after the activation process.

It has been discovered that a polymer article with an adherent metallic surface pattern may be formed by a two shot molding technique in which one molding shot utilizes a crystalline polymer resin and the other molding shot utilizes an amorphous polymer resin. The surface areas of the article which are to have a metallic area thereon are formed of the amorphous polymer resin, and the surface areas of the amorphous polymer resin, and the surface areas of the article which will not have metal are formed of the crystalline polymer resin.

The article formed by two shot molding is adhesion promoted by conventional treatment techniques such as exposing the surface areas of the article to strong oxidizers or to a solvent followed by strong oxidizers. The portion of the surface formed of amorphous polymer resin is made hydrophilic and receptive to adherent metallization by the adhesion promotion treatment. The portion of the surface formed of crystalline polymer resins is substantially unaffected by the adhesion promotion treatment and remains hydrophobic and resistant to adherent metallization. Metallization is accomplished by conventional techniques such as activation and electroless plating.

In the illustrated embodiment of the present invention, there is shown a method for forming a molded article for adherent metallization, such as a printed circuit board, using a two shot injection molding process. The process includes a first step of forming at least one first predetermined shape, such as a circuit pattern for a printed circuit board, by injection molding a first shot of electrically insulating material into a first mold cavity. The electrically insulating material selected for the first shot is treatable by an efficient and economical process to add metal thereto with strong adhesion of the metal to the insulating material. The metal can be copper to form electrically conductive paths on a printed circuit board. A second step is to remove the first predetermined shape from the first mold cavity and to insert the first predetermined shape into a second mold cavity. A third step is forming at least one second predetermined shape of the article, such as a support substrate for a printed circuit board, by injection molding a second shot of electrically insulating material into the second mold cavity. The second predetermined shape interconnects with the first predetermined shape to produce a molded one-piece article. The electrically insulating material selected for the second shot avoids metal adherence and performs as an electrical insulating material for a printed circuit board.

The article is then removed from the second mold cavity and processed by an additive process through a minimal series of steps to add metal only on selected surfaces of the first predetermined shape of the first shot injection molding.

DEFINITIONS

By amorphous thermoplastic polymers or resins is meant thermoplastic resins whose mechanical properties decrease at a relatively modest rate with increasing temperature until the onset of their glass transition. The temperature of the onset of glass transition marks the limit of their ability to bear continuous load and to remain dimensionally stable. Suitable amorphous resins include those listed with a Tg(amorphous) in the "Resins and Compounds" Property Chart, *Modern Plastics Encyclopedia* 1985-1986, Vol. 62, No. 10A, October 1985, McGraw-Hill Inc., New York, p. 448 et seq.

By crystalline thermoplastic polymers or resins is meant thermoplastic resins which have the ability to retain significant mechanical properties above their glass transition temperature range. This is due to their crystalline bonds and the fact that the crystalline melting point of a polymer always is substantially higher than its glass transition. Among the crystalline resins are those listed with a $T_m$(crystalline) in the "Resins and Compounds" Property Chart, *Modern Plastics Encyclopedia* 1985-1986, supra.

DETAILED DESCRIPTION OF THE INVENTION

In one aspect, this invention concerns an improved method of making a plastic insulating body with a conductive metal pattern adhered to its surface. The plastic insulating body is preferably made with two or more insulating resin compounds by a two shot or insert molding technique. Individual conductors of the conductive pattern are insulated from each other and from other conductors by the insulating resin compounds used in both molding shots. In order to form the conductive metal pattern adhered to the surface of the plastic insulating body, the plastic body is molded with the portion of its surface to be metallized comprising a first insulating resin compound, and the portion of its surface to be disposed around the metal portion of the pattern comprising a second insulating resin compound. The resin compounds are selected so that the portion of the surface comprising the first insulating resin compound may be adhesion promoted and made hydrophilic by an adhesion promotion process, and the portion of the surface comprising the second insulating resin compound is hydrophobic and not affected by the adhesion promotion process, or can be made hydrophobic during the metallizing process.

This invention is also concerned with the manufacture of three dimensional bases for printed circuits where the surface conductor features are not confined to planar surfaces, but can comprise any three dimensional features which can be molded.

It has been discovered that amorphous polymer resins may be adhesion promoted for adherent metal deposition by known chemical oxidizing systems. Surprisingly, it also has been discovered that crystalline polymer resins are resistant to the chemical oxidizing systems used to adhesion promote surfaces consisting of amorphous polymers. The surfaces consisting of crystalline resins remain hydrophobic while surface consisting of amorphous resins are easily adhesion promoted and made hydrophilic. Among the chemical oxidizing systems used to adhesion promote polymeric surfaces are plasma systems or oxidizing solutions of chromic acid or of permanganates. Frequently, a solvent or a solvent mixed with water is used as a pretreatment for the plastic surface before it is treated with the oxidizing solution which makes it hydrophilic.

A suitable method of forming the conductive metal pattern on the adhesion promoted portion of the surface is by electroless metal deposition.

In a preferred form of the invention, a plastic insulating body is molded with the first molding shot, the first insulating resin compound being an amorphous thermoplastic resin containing a catalyst for electroless metal deposition, and the second molding shot being a second insulating resin compound with is a crystalline thermoplastic resin. Fillers for the amorphous thermoplastic resin may be treated with catalyst for electroless metal deposition as described in U.S. Pat. Nos., 3,629,185; 3,600,330; 3,546,009 and 3,560,257, all to Schneble et al., which are incorporated herein by reference.

It is well known that crystalline polymers are only partially crystalline. X-ray results show conclusively that crystalline regions in polymers extend no more than a few hundred angstrom units even in the direction of the polymer chains. Since polymer molecules when completely extended (as they are in the crystals) are several times this length, the crystals can contain only sections of molecules. The polymer molecules pass successively through several crystalline and amorphous regions. Most crystalline polymers are estimated to be 50-75% crystalline, although some are known to be 75-85% crystalline.

When using an injection molding process with an amorphous resin for one shot and a crystalline resin for another shot according to this invention, the amorphous and crystalline resins selected should join together when molded to form a single self-adherent unit. It has been discovered that the bond joining the second shot resin is improved by preheating the first shot insert to a temperature just under the onset of the glass transition, $T_g$, for amorphous thermoplastic inserts, or just under the crystalline melting temperature, $T_m$, for crystalline thermoplastic inserts. The inserts are heated to 20°-80° C. below the $T_g$ or $T_m$, preferably 40°-70° C. below $T_g$ or $T_m$.

It also has been discovered that the injection time for the second shot should be less than 0.5 seconds, and preferably less the 0.3 seconds in order to get optimum adhesion and filling of the mold.

To improve the adherence between dissimilar resins in the first and second shots, the first shot mold can be textured at the areas which will be in contact with the second shot. The mold walls would not be textured in areas corresponding to portions of the first shot which will form part of the surface of the molded plastic insulating base. All surfaces that will be adhesion promoted are preferably polished or smooth in order to achieve a smooth metal coating.

Surfaces of second shot molding which are not to be plated should be highly polished to provide a smooth, hydrophobic surface that resists extraneous metal deposition.

An amorphous engineering polymer which is easily adhesion promoted is preferably selected for the surfaces to be metallized, and a crystalline engineering polymer which is hydrophobic and resistant to adhesion promotion is preferably selected for the surfaces which are not to be metallized. A crystalline polymer is not completely crystalline. It contains both crystalline and amorphous portions. The amount of crystallinity depends to some extent on the molding temperature and molding cycle. The crystallinity can be decreased by additives, plasticizers, polymer blending or alloying, copolymerization, and side chains on the resin molecule. By increasing the amorphous character of a crystalline resin, the same generic resin can be used for both moldings, a resin with a high percentage of amorphous character for the molding to be adhesion promoted and metallized and a similar resin with a high percentage of crystallinity for the hydrophobic molding which is resistant to adhesion promotion. Good adhesion between the two moldings is ensured by using the same generic resin for both moldings.

The resins can be provided with fillers for reinforcement and with colorants. It is preferred to add a filler catalytic for electroless metal deposition to the amorphous resin, or the resin whose surface is to be metallized. The catalytic filler may be ½%, preferably 3 to 15%, based on the thermoplastic resin. Fillers containing trace amounts of iron, and some colorants containing carbon black and copper phthalocyanine pigments should be avoided in the crystalline resin which is not to be metallized. These fillers and colorants sometimes catalyze extraneous electroless metal deposition on the hydrophobic resin surface.

Figure 1:
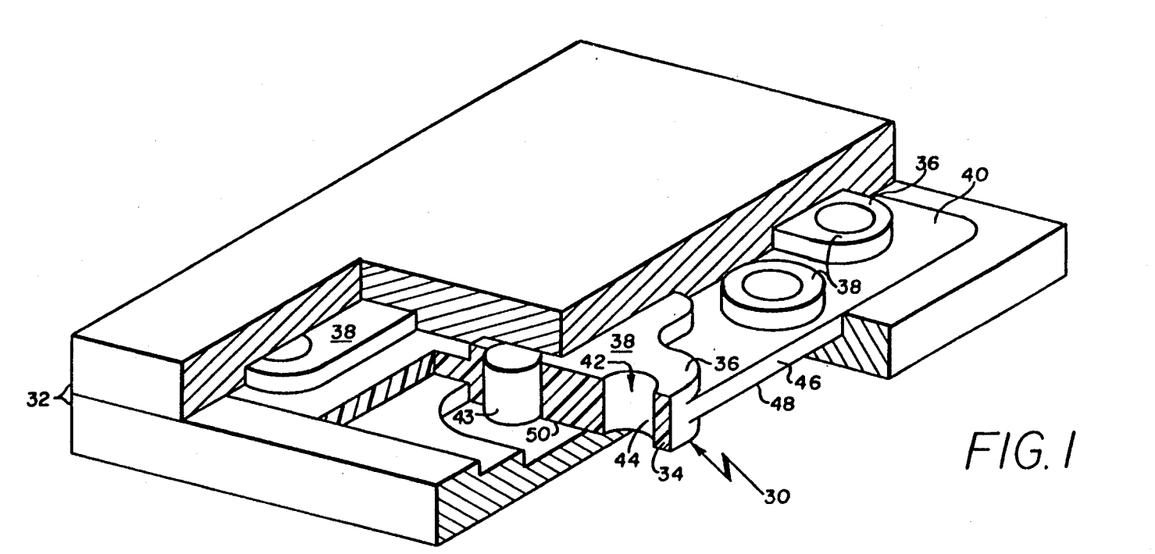
FIG. 1 is a perspective view of a portion of a first cavity mold forming a first predetermined shape of an article, such as a circuit pattern, by a first shot injection molding process in accordance with a present invention.

Referring to FIG. 1, a circuit pattern 30 is formed by a first shot injection molding process in a first mold cavity 32. A preferred first electrically insulating material 34 selected for this circuit pattern is polyethersulfone with catalyst. A suitable polyethersulfone is Victrex TM 4100 G commercially available from ICI Americas Inc., Wilmington, Del. One suitable filler catalyst is a palladium catalyst dispensed on a powdered aluminum silicate clay as is disclosed in U.S. Pat. No. 3,600,330 by Example 6 and Example 9. The catalyst mixed into the first electrically insulated material 34 catalyzes the material for electroless metal deposition in subsequent steps in the process. The electrically insulating material 34 can be treated by a minimal series of steps to add metal for forming electrically conductive paths 36 in a printed circuit board. Adhesion promotion of insulating materials containing the catalyst activates the material for electroless metal deposition. Approximately 20% glass filler can be added to the electrically insulating material 34. However, the metal surfaces formed on the base material are smoother when using polyethersulfone without the glass filler.

Other suitable electrically insulating materials for the circuit pattern 30 are ceramics, thermoset polymers and high temperature thermoplastic materials. Especially suitable as insulating materials for the circuit pattern are the non-crystalline, amorphous thermoplastics. The amorphous thermoplastics are preferred for the circuit pattern because they can be adhesion promoted for adherent electroless metal deposition by treatment with aqueous solutions of strong oxidizers such as chromic acid or permanganate, or by the swell and etch technique which uses a solvent treatment to enhance the action of the oxidizers. Among the amorphous, high temperature, thermoplastic materials useful for this invention are polyetherimides, and the sulfone resins, polysulfone, polyarylsulfone and polyethersulfone. These resins are in the group known as engineering plastics. Other suitable amorphous resins with lower service temperature include ABS (acrylonitrile-butadiene-styrene copolymers). The plateable grades of ABS can be adhesion promoted without a solvent swell.

Figure 2:
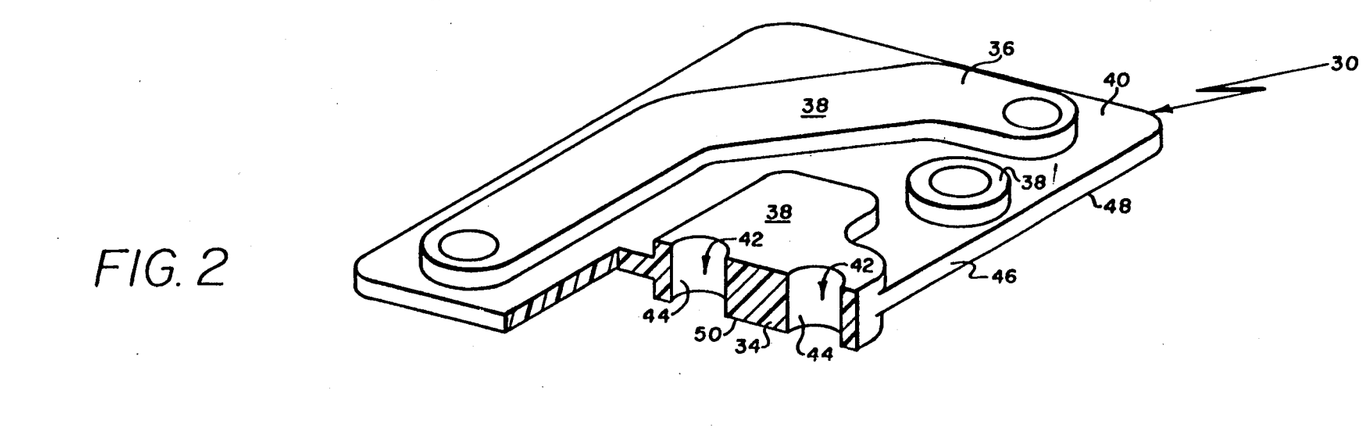
FIG. 2 is a perspective view of the circuit pattern removed from the first cavity mold.

Referring to FIG. 2, the circuit pattern 30 has several full surface sections 38 on a first component side 40. Some of the full surface sections 38 have holes 42 which typically extend all the way through the thickness of the circuit pattern 30. The holes 42, formed by pins 43 (only one shown—FIG. 1), have interior walls 44 for treatment to form electrically conductive paths 36 through the thickness of the circuit pattern 30. The circuit pattern 30 has a web portion 46 for connecting the full surface sections 38 to each other and for spacing the full surface sections 38 relative to each other. The web portion 46 is recessed below the full surface sections 38.

A second or solder side 48 of the circuit pattern 30 has several full surface sections 50 (only one is shown).

The web portion 46 connects the full surface sections 50 to each other and spaces the full surface sections 50 relative to each other. The circuit pattern 30 having the full surface sections 38, the full surface sections 50 and the web portion 46 fabricated by the first shot injection molding process forms a one-piece integral unit.

A feature of this invention is that the web portion 46 provides a rigid connecting structure between the full surface sections 38 on the component side 40 and the full surface sections 50 on the solder side 48 as well as between the several full surface sections 38 and 50 on each side of the circuit pattern.

In an injection molding process when the circuit pattern 30 is inserted into a second mold cavity, and a second material is molded over the circuit pattern, the rigid connection structure of the web portion 46 may impede the flow of the second material into the mold. To balance the pressure on both sides of the circuit pattern 30 and improve the flow of the second material, second shot, the connection structure of the web portion 46 may be provided with additional holes or openings (not shown) which are not in the surface sections 38. Openings in the web portion are preferred for improving the flow of the second shot, since alternative procedures for improving flow such as raising the temperature of the mold or of the second shot resin or increasing the molding pressure may soften and distort the circuit pattern 30.

Another feature of this invention is that the circuit pattern 30 with the web portion 46 can be used as both the circuit pattern and an insulating substrate by selective treatment of the circuit pattern 30 to form electrically conductive paths 36.

Figure 3:
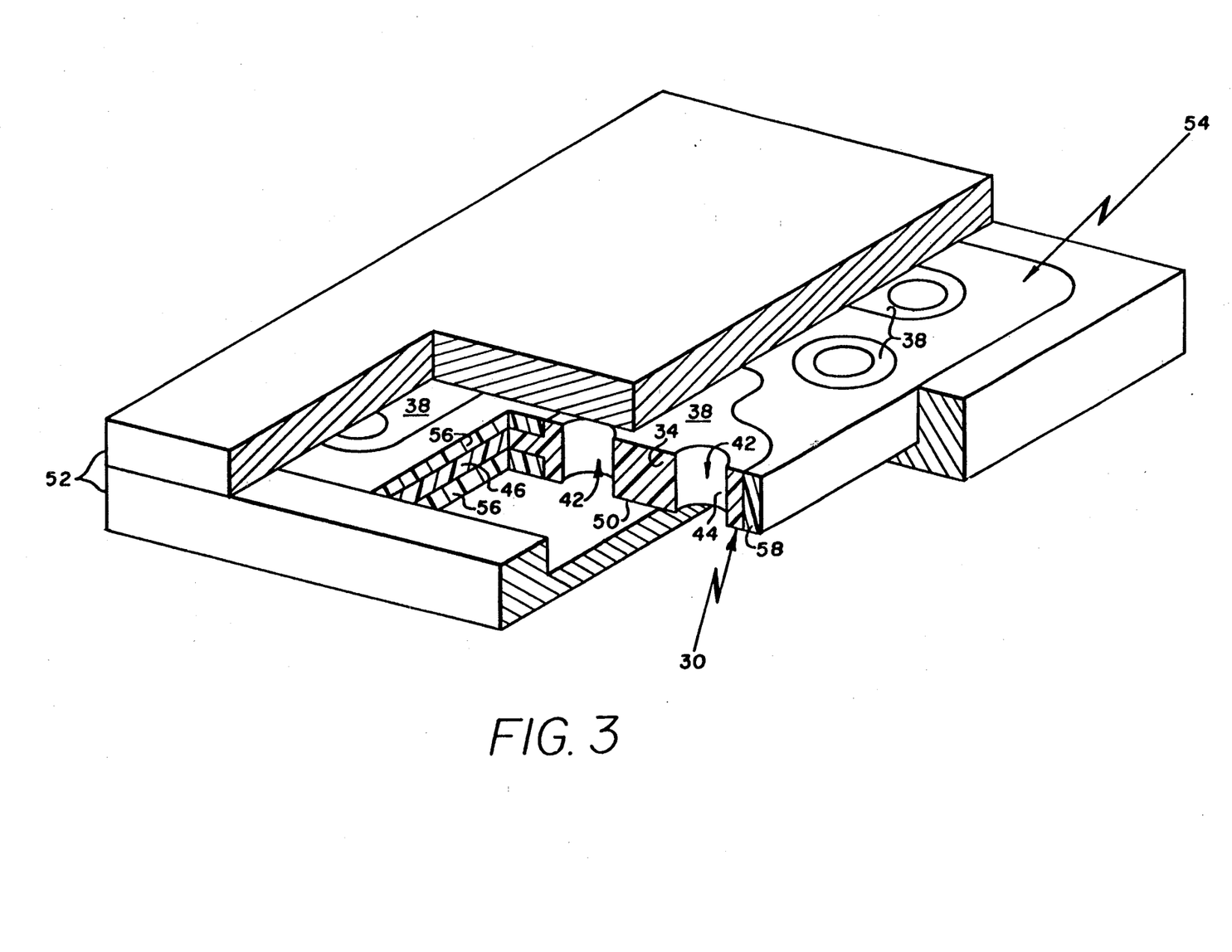
FIG. 3 is a perspective view of a portion of a second cavity mold forming a second predetermined shape of an article, such as a support structure, by a second shot injection molding process onto the circuit pattern of FIG. 2.

Referring now to FIG. 3, the circuit pattern 30 has been removed from the first mold cavity 32 and inserted into a second mold cavity 52. A support structure 54 is formed by a second shot injection molding process in the second mold cavity 52 and onto the molded circuit pattern 30. A second electrically insulating material 56 selected for the support structure 54 is polyethersulfone (Victrex 200P without a catalyst) or a crystalline thermoplastic polyphenylene sulfide Ryton TM R-4 from Phillips Chemical Co., Bartlesville, Okla. The electrically insulating material 56 may be reinforced with glass, mineral or other fillers. It is believed to be preferable to use reinforcing fillers in this material to provide rigidity to the support structure 54. Other suitable materials for the second insulating material include ceramics, thermoset resins, and high temperature thermoplastic materials including polyesters.

Particularly preferred materials for the second insulating material are crystalline, high temperature, thermoplastic resins which are hydrophobic and not affected by the adhesion promotion techniques used to adhesion promote the amorphous resins preferred for the first insulating material. Among the crystalline, high temperature, thermoplastic resins suitable for this purpose are polybutylene terephthalate, polyethylene terephthalate, polyphenylene sulfide and polyetheretherketone. These high temperature resins are also in the group known as engineering plastics. Suitable crystalline resins for low temperature service which are unaffected by the processes used to adhesion promote amorphous resins of the first shot are believed to include polyvinyl chloride, polyethylene and polypropylene.

The electrically insulating material 56 of the support structure 54 covers the web portion of 46 on the component side 40 and on the solder side 48 of the circuit pattern 30 while leaving the full surface sections 38 and 50 exposed. The electrically insulating material 56 of the support structure 54 is prevented from entering the holes 42 of the circuit pattern 30 by the second cavity mold 52. The electrically insulating material 56 of the support structure 54 also forms a border 58 around the periphery of the circuit pattern 30. The support structure 54 with the circuit pattern 30 is removed from the second cavity mold 52 and is ready for further processing (FIG. 4).

Another feature of this invention is that the support structure 54 is rigidly connected to the circuit pattern 30 by covering the web portion 46 on the component side 40 and the solder side 48 and by forming a border 58 around the periphery of the circuit pattern 30.

Figures 4, 5:
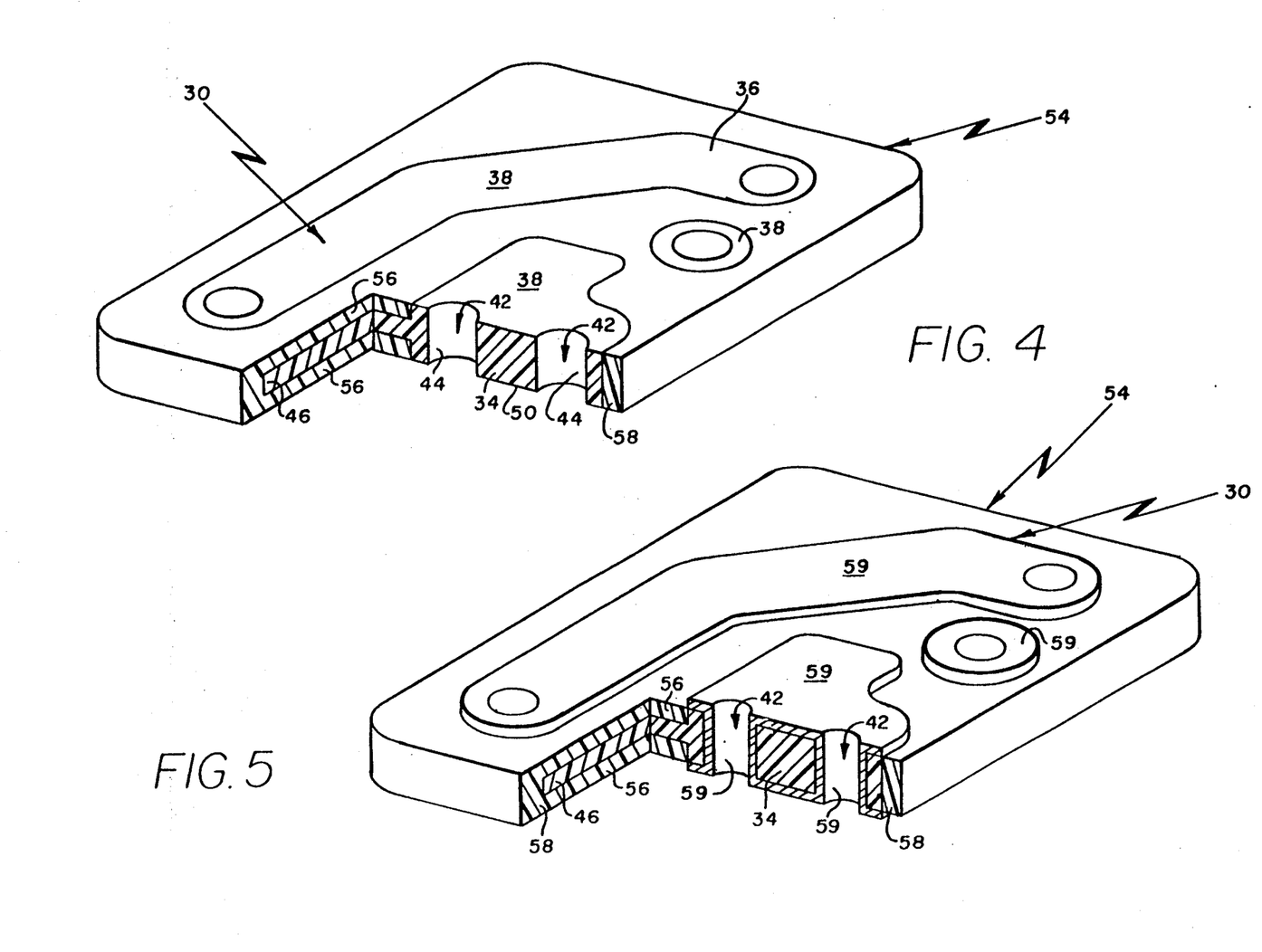
FIG. 4 is a perspective view of the support structure including the circuit pattern removed from the second cavity mold.
FIG. 5 is a view similar to FIG. 4 showing a step of adding a layer of copper to the exposed surfaces and holes formed by the first shot injection molding thereby forming the electrically conductive paths on the printed circuit board.

Referring to FIG. 4, an alternate method of the present invention is forming the support structure 54 by a first shot injection molding process in a first mold cavity and forming the circuit pattern 30 by a second shot injection molding process in a second mold cavity while maintaining the rigid connection structure 54. Preferably, the second shot would comprise more than one molded shape.

A layer of metal 59, such as copper, is adhered to the circuit pattern 30 (FIG. 5) to form the electrically conductive paths 36 by subsequent steps in the process. Since the first material 34 is capable of adherent metallization and the second material 56 is incapable of adherent metallization, the metal 59 adheres only to the circuit pattern 30 formed from the first material 34.

Figure 6:
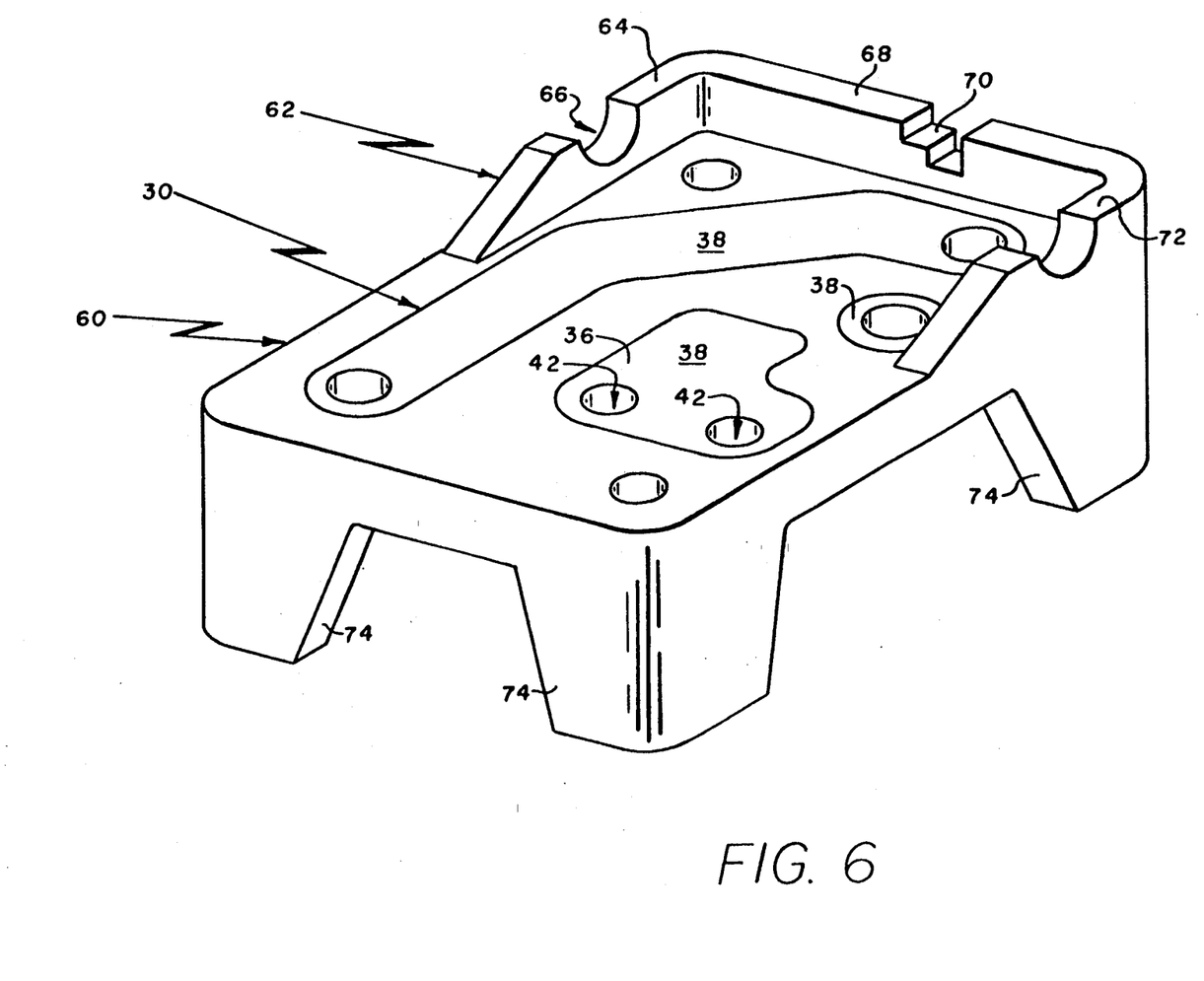
FIG. 6 is an alternative embodiment of FIG. 4 showing additional structure integrally molded with the support structure of the second shot injection molding process.

Referring to FIG. 6, another embodiment of the present invention is a support structure 60. The support structure 54 shown is FIG. 4 has a rigid flat structure which is typical for printed circuit boards. The support structure 60 has three-dimensional additional integrally molded structure 62 for mounting non-electrical components such as shafts, brackets and the like or for use as spacers, stand-offs and the like. The structure 62 is molded from the electrically insulating plastic material 56. The molded structure 62 avoids costly secondary operations such as attaching independently made brackets, frames, and the like, to provide the same result.

The structure 62 has a first upstanding wall 64 with a circular recess 66 therein for supporting a non-electrical component such as a cylindrical shaft. A second upstanding wall 68 has varying sized notches 70 for supporting rectangularly shaped components. A third upstanding wall 72 is similar to the first upstanding wall 64. Several legs 74 extend downward from the circuit pattern 30. The legs 74 can be used as spacers for spacing the circuit pattern 30 from other structures in any machine or apparatus. The upstanding walls 64, 68 and 72 and the legs 74 are examples of varying structure which can be integrally molded with the second shot injection molding process to reduce or avoid the cost of secondary operations such as adding independently made support brackets, frames, and the like. The support structure 60 can be treated by the same process as the support structure 54 to form the electrically conductive paths 36.

Figures 7, 8:
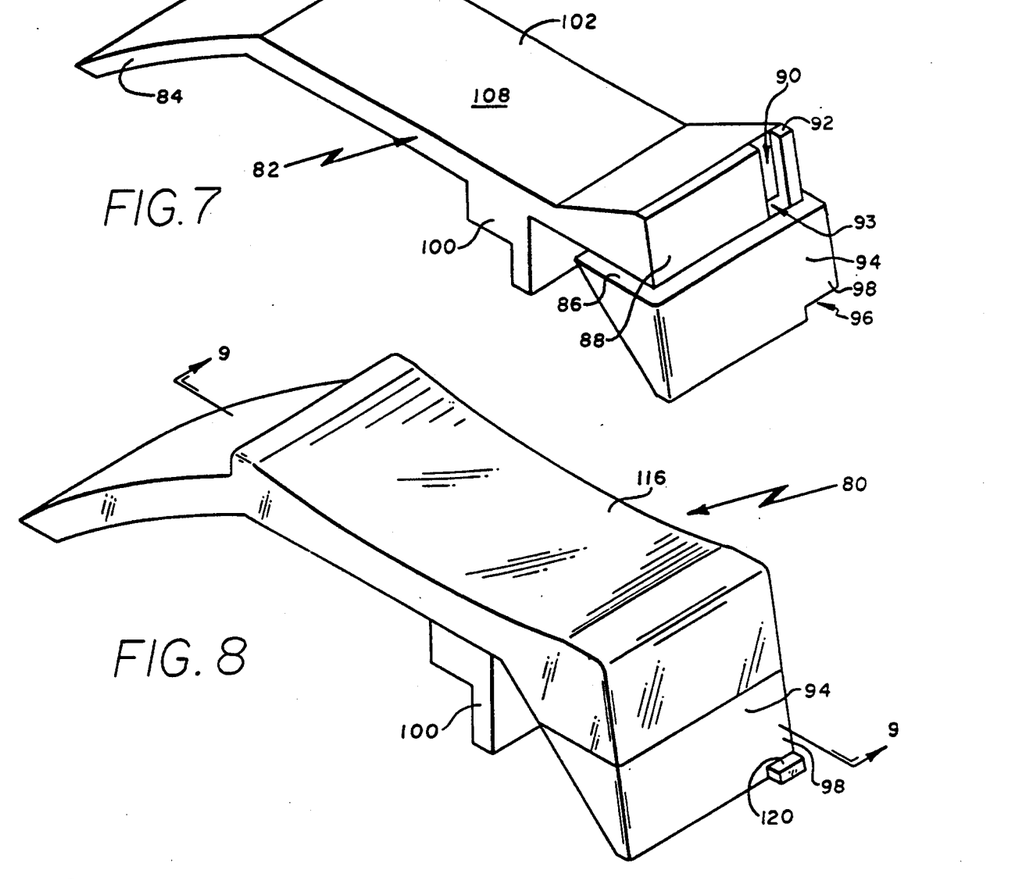
FIG. 7 is a perspective view of a first predetermined shape molded according to the present invention.
FIG. 8 is a perspective view of an article used in printing machines representative of many articles capable of being formed by the first and second shot injection molding process according to the present invention.
Figure 9:
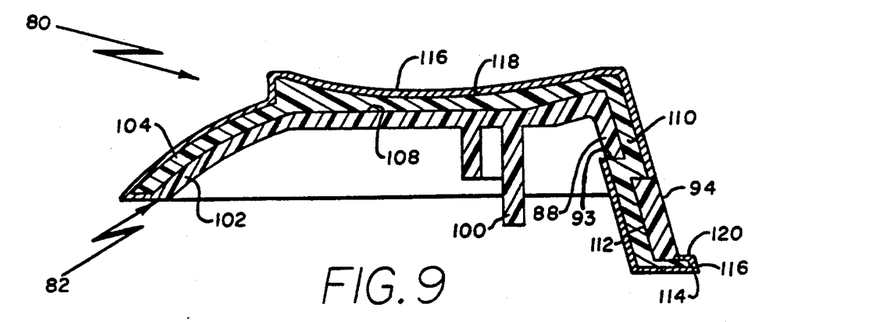
FIG. 9 is a side view in cross section taken along the line 9—9 of FIG. 8 showing the molded article of FIG. 7 after metallizing.

Referring to FIGS. 7-9, a linespace selector button 80 is an example of an article, representative of many articles, formed in accordance with the present invention. The button 80 selects a variable number of linespace increments for linespacing a work sheet in printing machines. A first predetermined shape 82 (FIG. 7) of the button 80 is formed by molding a first material 84. The shape 82 has a ridge 86 extending beyond a front wall 88. A U-shaped recess 90 extends from an upper surface 92 of the front wall 88 downward to the ridge 86 and then leftward through an opening 93 in the front wall 88. A second front wall 94 has a notch 96 at one corner 98. A rib 100 projects downward and across a main body portion 102 of the first shape 82 for attaching the button 80 to the printing machine. The first material 82 is selected to resist adhesion promotion or to be non-catalytic for and incapable of being rendered catalytic for adherent metallization.

A second predetermined shape 104 (FIG. 9) of the button 80 is formed by molding a second material 106 onto the first material 84. The second shape 104 substantially covers a top surface 108 of the first shape 82 including the front wall 88. An extension 110 fills the recess 90, passes through the opening 93, extends downward against an inside wall 112 of the second front wall 94, and projects rightward through the notch 96 and beyond the second front wall 94 to form a pointer 114. The second shape 104 interconnects with the first shape 82 by the extension 110 filling the recess 90, passing through the opening 93 and being against the inside wall 112 to produce the button 80 as a one-piece article.

A layer of metal 116 is adhered to the second shape 104 at a first outer exposed surface area 118 of the main body portion 102 and at a second outer exposed surface area 120 of the pointer 114. The second material 106 is selected for being capable of adhesion promotion by an adhesion promotion process and for being catalytic for adherent metallization or capable of being rendered catalytic for adherent metallization by an activating process. Since the first material 84 is incapable of adherent metallization and the second material 106 is capable of adherent metallization, the metal 116 adheres only to the second shape 104.

The metal 116 has a shiny chrome finish and has been adhered to the first area 118 for aesthetic purposes and to the second area 120 for causing pointer 114 to be readily noticeable.

Even though the molding process just described is injection molding, the circuit pattern 30, the support structure 54, the first shape 82 and the second shape 104 can also be formed by compression, casting and other molding processes.

The selected first plastic material 34 and the second plastic material 56 are thermoplastics. Other materials could be used by the invention such as thermoset resins, ceramics, glass, and the like.

In injection molding thermoplastics, it is standard practice to dry the resin before molding. To practice this invention by injection molding, it has been found that the drying process is more critical for water vapor than most molding processes, and even more critical then normal for engineering plastic molding. Requirements are more stringent than normal practice where the primary attribute of the finished molding is its appearance. Traces of moisture remaining in the resin used to make the first shot will make the part stressed and porous, and when the second shot is molded, the heating of the first shot will be uneven due to the porous portions of the insert. The result will be poor filling of the mold by the second shot due to temperature variations. Moisture in the second shot resin will also induce stress, poor bonding between the first and second shot, and impede the filling of the mold due to expansion of the water vapor with heat. Attempts to overcome traces of moisture in the second shot resin require more heat or more pressure and result in distorting the insert.

Further, the stresses induced by traces of water in the resin affects the post molding adhesion promotion and plating processes.

One method of adequately driving off moisture from the engineering plastic resins is to heat the resin to 120°–175° C. for three to four hours. In addition to the standard practice which requires the operating temperature of the drier to be 120°–170° C., it is necessary to measure the temperature at many points in the resin batch, not only the center, but also the edges, and ensure that all portions of the resin are at drying temperature.

The first shot molding or insert is preheated before it is inserted into the second shot mold. The preheat temperature is preferably below the glass transition temperature of an amorphous resin, or below the heat distortion temperature of a crystalline rein. If the temperature of the insert is too low, there will be voids in the second shot and poor adhesion leading to separation between the first and second moldings.

The injection molding press and the gating of the mold should be selected to fill the second shot mold in under one second, preferably in under 0.5 second, and more preferably in under 0.3 second. The optimum molding temperature for adherence of the second shot to the first shot insert is in a narrow range. If the mold is not filled in under 0.5 second, it is difficult to achieve good temperature control and good adherence. If the temperature is controlled by raising the mold temperature instead of filling the mold faster, there is a danger of softening the insert and moving the surface features of the insert out of position.

To add the metal 59 to the circuit pattern 30 (FIG. 5) for forming electrically conductive paths 36 and to add the metal 116 to the button 80 (FIG. 8) for aesthetic or pointer purposes, a few process steps are taken.

These steps are described in the examples below:

EXAMPLE I

In this example, the circuit pattern 30 was molded with polyethersulfone resin (Victrex P200 TM commercially available from ICI Americas Ltd.) containing 15% of a palladium treated clay filler. The clay filler (commercially available from PCK Technology Division of Kollmorgen Corp.) contains 0.1% palladium by weight. The support structure 54 was molded with polyethylene terephthalate resin (Rynite TM commercially available from E. I. DuPont de Nemours and Co., Inc., Wilmington, Del.).

The molded article was stress relieved by placing it in an oven; raising the oven temperature to 200° C., holding the article at temperature for four hours and then cooling the article in the oven.

After the article was stress relieved, it was adhesion promoted by the following procedure.

Adhesion Promotion

1. Immerse for one minute in a solution of 90% dimethylformamide and 10% water.

2. Immerse for one minute in an aqueous 0.4 g/l solution of Gafac TM RE 610 at 60° C.

3. Immerse for one minute in an aqueous solution of 48% sulfuric acid at 60° C.

4. Etch for two minutes at 60° C. in an aqueous solution containing:

| solution containing: | |
| --- | --- |
| chromium trioxide | 400 g/l |

-continued

| solution containing: | |
|---|---|
| sulfuric acid | 450 g/l |
| Perfluoroalkysulfonate (commercially available as FC-98 ™ from 3M Corp.) | 0.5 g/l |

5. Rinse in a dragout rinse.
6. Neutralize the residual chromium by immersion for five minutes in a solution of 1.8% sulfuric acid and 1.4% hydrogen peroxide.
7. Repeat step 6 in another neutralizing solution of the same composition.
8. Rinse in water for two minutes.

The adhesion promotion process made the circuit pattern on the surface of the article microporous and hydrophilic, and exposed the catalyst on the surfaces sections 38 and 50 and hole walls 44 of the circuit pattern 30. This portion of the surfaces of the article, which were smooth and shiny before adhesion promotion, assumed a matte appearance. This activated the surfaces 38, 50 and 44 for electroless metal deposition. The portion of the surfaces which was composed of the support structure 54 remained smooth and shiny.

Adherent Metallization

The molded article was immersed in an electroless copper plating solution for five hours to deposit a layer of copper 25 micrometers thick on the surface sections 38 and 50 and hole walls 44. The electroless copper solution had the following composition:

| Copper | 0.05 m/l |
|---|---|
| Ethylenediaminetetra-2-propanol | 0.08 m/l |
| Formaldehyde | 0.05 m/l |
| Alkylphenoxyglycidolphosphate ester (Gafac RE 610, commercially available from GAF Corp.) | 0.0009 m/l |
| Sodium cyanide (by specific ion electrode) | 0.0002 m/l |
| Potassium selenocyanate | 0.007 m/l |
| Alkali metal hydroxide | to ph at 25° C. 12.8 |

The copper plating on the surface sections 38 and 50 and the hole walls 44 was uniform and free of breaks or pinholes. No copper was deposited on the smooth shiny surface of the support structure 54.

The bond strength of the copper to the surface sections 38 and 50 was 1.4 N/mm (8 lbs./in.).

EXAMPLE II

The procedures of Example I are repeated using electroless nickel plating solutions instead of electroless copper.

EXAMPLE III

An article corresponding to the circuit pattern 30 of FIG. 2 was molded of polyethersulfone resin which was non-catalytic for electroless metal plating. A support structure of 54 FIG. 4 was molded of a polybutylene terephthalate resin (commercially available as Valox ™ from General Electric Co., Pittsfield, Mass.).

The molded article was stress relieved by exposure to microwave radiation for 30 minutes following procedures of Frisch et al., U.S. Pat. No. 4,424,095.

The molded article was adhesion promoted by the procedure of Example I.

The adhesion promoted article was activated for electrolessly depositing copper by the following procedure.

1. Immerse the adhesion promoted article for five minutes at 50° C. into an aqueous solution of a radiation-sensitive composition according to Polichette et al. U.S. Pat. No. 3,993,802 having the composition:

| Sorbitol | 220 g/l |
|---|---|
| 2,6-Anthraquinone disulfonic acid disodium salt | 16 g/l |
| Cupric acetate | 8 g/l |
| Cupric bromide | 0.15 g/l |
| Nonylphenoxypolyethoxyethanol | 2.0 g/l |
| Fluoroboric acid | to a pH of 3.75 |

2. Dry the molded article 50° C. for five minutes to obtain a radiation-sensitive coating on the base material.
3. Expose the molded article to ultraviolet light to obtain a layer of copper nuclei.
4. Immerse and agitate the molded article in an aqueous solution of pH 12.5 containing 1.3 m/l formaldehyde and 0.1 m/l ethylenedinitrilotetraacetate for five minutes.
5. Repeat step 4 in a second solution of the same composition except that it contains 0.13 m/l formaldehyde.
6. Rinse in water.

This procedure produced a dark layer of copper nuclei on the surfaces sections 38 and 50 and on the hole walls 44 of the molded article. The copper nuclei were electrolessly plated to a 25 micrometers thick layer of copper as in Example I to produce finished printed circuit board with electrically conductive paths 36.

Another method for molding an article formed from electrically insulating materials, such as a printed circuit board, using the present invention is by selecting as the first electrically insulating material 34 a polyethersulfone, such as Victrex P200, without a catalyst. This first electrically insulating material 34 is used in the first shot molding process to form a circuit pattern 30. The second electrically insulating material 56 can be polyester also without a catalyst. A suitable polyester is polyethylene terephthalate (Rynite ™ commercially available by E. I. DuPont de Nemours and Company, Wilmington, Del.). This second electrically insulating material 56 is used in the second shot molding process to form the support structure 54. The circuit pattern 30 is then annealed and treated with the solvent-swell and etch solution as previously described. The next step is to add a plating catalyst to the surfaces of the circuit pattern 30. Suitable plating catalysts for this step are disclosed in U.S. Pat. No. 4,450,190.

After adhesion promotion of the circuit pattern 30 as in Example I, the molded article is activated for electroless metal deposition by:

1. Immersion for 15 minutes in an aqueous solution which contains solid metallic copper and:

| $CuCl_2 \cdot 2H_2O$ | 60 g/l |
|---|---|
| CuCl | 35 g/l |
| Hydrochloric Acid | 200 ml/l; |

2. Rinse in water for one minute;
3. Immersion for ten minutes in an aqueous solution containing

| | |
|---|---|
| NaBH₄ | 1 g/l |
| NaOH | 1.5 g/l; and |
| rinse. | |

The support structure 54 is then put through a suitable strong water spray, optionally combined with a brush, to wash off the non-adherent catalyst. The final step is to add approximately 0.025 mm copper plate to the circuit pattern 30 by using an electroless copper solution.

EXAMPLE IV

A two shot molded printed circuit printed circuit base was prepared by the following procedure. The first shot was molded of an amorphous thermoplastic resin compound containing a catalyst for electroless metal deposition. The thermoplastic was a polyarylsulfone resin (Radel PXM TM 85113 from Amoco Performance Products, Danbury, Conn.) containing 3% of a clay filler treated with 1100 ppm palladium (Cat 10 TM from PCK Technology Division, Kollmorgen Corporation, Melville, N.Y.). This was molded with elevated surface features corresponding to the areas which were to be metallized to form a printed circuit Before molding the polyarylsulfone resin it was dried for four hours at 120° C. (250° F.).

The first shot was molded in a horizontal 100 ton injection molding machine with a 5 ounce (142 gram) barrel (Model 100TG TM from Reed-Prentice Division, Package Machinery Co., East Longmeadow, Mass.). This first shot including the runner and sprue, weight 7.6 grams, and without the runner and sprue, weighed 3.2 grams. The barrel temperatures were: rear zone—350° C. (660° F.), center zone—360° C. (680° F.), front zone—360° C. (680° F.) and nozzle—365° C. (690° F.). The mold temperature was 120° C. (250° F.). The injection pressure was 90 MPa (1300 psi); there was no back pressure. The injection time was 0.5 seconds. The holding pressure was 40 MPa (600 psi), and the holding time was 1.8 seconds. The cure time was 12 seconds.

The second shot was molded around the first shot not covering the elevated surface features. A crystalline thermoplastic resin compound, polyphenylene sulfide (Ryton R-4 from Phillips Chemical Company., Bartlesville, Okla.) was used for the second shot. The second shot weighed 19.7 grams, including the runner and sprue, but not including the first shot insert. The second shot weighed 14.9 grams, excluding the runner and sprue without the insert, and 18.1 grams with the insert.

Before molding the second shot, the polyphenylenesulfide resin compound was dried for three hours at 120° C. (250° F.).

The first shot insert was heated at 150° C. (300° F.) before loading it into the mold for the second shot. The barrel temperatures for the second shot were: rear zone— 255° C. (490° F.), center zone, front zone and nozzle—260° C. (500° F.). The mold temperature was 135° C. (275° F.). The injection pressure was 97 MPa (1400 psi) and there was no back pressure. The injection time was 0.01 second. The holding pressure was 44 MPa (635 psi) and the holding time was 8 seconds. The cure time was 15 seconds.

This produced a molded plastic base with a surface pattern of amorphous polyarylsulfone corresponding to the desired metal conductor pattern, and crystalline polyphenylene sulfide corresponding to the desired surface insulating pattern.

The amorphous polyarylsulfone portion of the surface was adhesion promoted by the procedures described in Example I. The crystalline polyphenylene sulfide resin was unaffected by the adhesion promotion process. The adhesion promotion exposed the catalytic filler in the amorphous resin surface, and the amorphous resin surface was electrolessly plated with copper in the electroless copper deposition solution of Example I. The solution deposited 25 micrometers of copper over the adhesion promoted amorphous resin surface and no copper on the crystalline resin surface.

EXAMPLE V

In this example, the circuit pattern 30 was molded with polyethersulfone resin (Victrex P200 TM commercially available from ICI Americas Ltd.) containing 15% of a palladium treated clay filler. The clay filler (commercially available from PCK Technology Division of Kollmorgen Corporation) contains 0.1% palladium by weight. The support structure 54 was molded with clear polyethersulfone resin without filler.

The molded article was stress relieved by placing it in an oven; raising the oven temperature to 205° C., holding the article at temperature for four hours; and then cooling the article in the oven.

After the article was stress relieved, it was adhesion promoted by the following procedure.

Adhesion Promotion

1. Immerse for one minute in a solution of 90% dimethylformamide and 10% water.
2. Immerse for one minute in an aqueous 0.4 g/l solution of Gafac TM RE 610 at 60° C.
3. Immerse for one minute in an aqueous solution of 48% sulfuric acid at 60° C.
4. Etch for two minutes at 60° C. in an aqueous solution containing:

| solution containing: | |
|---|---|
| chromium trioxide | 400 g/l |
| sulfuric acid | 450 g/l |
| Perfluoroalkysulfonate | 0.5 g/l |
| (commercially available as | |
| FC-98 TM from 3M Corp.) | |

5. Rinse in a dragout rinse.
6. Neutralize the residual chromium by immersion for five minutes in a solution of 1.8% sulfuric acid and 1.4% hydrogen peroxide.
7. Repeat step 6 in another neutralizing solution of the same composition.
8. Rinse in water for two minutes.

The adhesion promotion process made the surface of the article microporous and hydrophilic, and exposed the catalyst on the surfaces sections 38 and 50 and hole walls 44 of the circuit pattern 30. All the surfaces of the article, which were smooth and shiny before adhesion promotion, assumed a matte appearance. This activated the surfaces 38, 50 and 44 for electroless metal deposition.

Adherent Metallization

The molded article was immersed in an electroless copper plating solution for one hour to deposit a layer of copper 3 micrometers thick on the surface sections 38 and 50 and hole walls 44. The electroless copper solution had the following composition:

| | |
|---|---|
| Copper | 0.05 m/l |
| Ethylenediaminetetra-2-propanol | 0.08 m/l |
| Formaldehyde | 0.05 m/l |
| Alkyphenoxyglycidolphosphate ester (Gafac RE 610, commercially available from GAF Corp.) | 0.0009 m/l |
| Sodium cyanide (by specific ion electrode) | 0.0002 m/l |
| Potassium selenocyanate | 0.007 m/l |
| Alkali metal hydroxide | to pH at 25° C. 12.8 |

The article was then rinsed; dried at 65° C. for thirty minutes; immersed in dichloromethane vapors over boiling dichloromethane liquid; and dried again at 60° C. for thirty minutes. In this process the matte, hydrophilic surface of support structure 54 is made smooth, hydrophobic and resistant to extraneous metal deposition.

The molded article was cleaned in a hot alkaline soak cleaner, rinsed, deoxidized in dilute sulfuric acid and returned to the electroless copper plating solution to deposit 25 micrometers of metal 59, such as copper, on the surfaces sections 38 and 50 and the hole walls 44 to complete the adherent metallization step to form the electrically conductive paths 36.

Alternatively, it is believed that the circuit pattern 30 may be molded using a titanium dioxide filled resin and the support structure 54 molded of an unfilled resin. Such a molded article may be adhesion promoted and treated with a palladium chloride solution by the procedures described in Janssen et al. U.S. Pat. No. 3,758,304; Lippits et al. U.S. Pat. No. 4,085,285 and Jans U.S. Pat. No. 4,451,505. Thus, the molded article would be exposed to ultraviolet light producing a latent metal image on the surface selection 38 and 50 and the hole walls 44. The excess palladium chloride would be rinsed away from the surface of the support structure 54 by the procedures described in the above-mentioned patents. A layer of copper than may be deposited on the palladium image. The molded article may be treated with dichloromethane vapors as in Example V to make the surface of the support structure 54 smooth and hydrophobic before electrolessly plating thicker copper layers.

It can now be easily understood that the method for molding an article for adherent metallization formed from electrically insulating materials, such as a printed circuit board 54 or a linespace selector button 80, has been significantly simplified by the present invention. Forming a circuit pattern 30 by a first shot injection molding process and interconnecting a support structure 54 or substrate to the circuit pattern 30 by using a second shot injection molding process to electrically insulate the circuit pattern 30, except for selected surfaces 38 and 50 being left exposed, reduces the number of steps required to treat the exposed surfaces 38 and 50 to form electrically conductive paths and to treat the exposed surface areas 118 and 120 for aesthetic and pointer purposes. This simplified method is particularly advantageous when producing these articles in high quantities.

This simplified method is further advantageous by being capable of integrally molding additional structure with the second shot injection molding process for mounting or attaching to non-electrical components.

What is claimed is:

1. A process for forming a plastic article with a metallic pattern on its surface comprising:
   using an amorphous, high temperature thermoplastic resin compound selected from the group consisting of polysulfone, polyethersulfone, polyarylsulfone and polyetherimide to form at least one first insulating shape, the first insulating shape being formed by injection molding, the resin compound forming the first insulating shape including a catalyst treated filler for electroless metal deposition;
   using a crystalline, high temperature, thermoplastic resin compound, the crystalline thermoplastic resin compound being substantially free of catalyst for electroless metal deposition and selected from the group consisting of polyesters, polyphenylene sulfide and polyetheretherketone, to form at least one second insulating shape around the first shape making a unitary article having exposed on its surface a plurality of predetermined areas consisting of the first shape surrounded by areas of the second shape, the second insulating shape being formed around the first insulating shape by an injection molding process wherein the injection time is less than 0.5 seconds;
   treating the unitary article to adhesion promote only the surface areas composed of the amorphous resin compound of the first shape; and
   electrolessly depositing metal on the surface portions of the unitary article composed of the first shape.

2. The process of claim 1 wherein the first shape is preheated to a temperature just below the onset of glass transition temperature before molding the second insulating shape around it.

3. The process of claim 1 wherein the injection time for the injection molding process is less than 0.3 seconds.

4. A process for forming a plastic article with a metallic pattern on its surface comprising:
   using a crystalline, high temperature, thermoplastic resin compound, the crystalline thermoplastic resin compound being substantially free of catalyst for electroless metal deposition and selected from the group consisting of polyesters, polyphenylene sulfide and polyetheretherketone, to form at least one first insulating shape, the first insulating shape being formed by injection molding;
   using an amorphous, high temperature, thermoplastic resin compound selected from the group consisting of polysulfone, polyethersulfone, polyarylsulfone and polyetherimide to form at least one second insulating shape making a unitary article having exposed on its surface predetermined areas of the first shape and a plurality of predetermined areas of the second shape, the resin compound forming the second shape including a catalyst treated filler for electroless metal deposition, the second insulating shape being formed by an injection molding process wherein the injection time is less than 0.5 seconds,
   treating the unitary article to adhesion promote only the surface areas composed of the amorphous resin compound of the second shape; and
   electrolessly depositing metal on the surface portion of the unitary article composed of the second shape.

5. The process of claim 4 wherein the first shape is preheated to a temperature 20°–80° C. below the crystalline melting temperature before molding on the second insulating shape.

6. The process of claim 4 wherein the injection time for the injection molding process is less than 0.3 seconds.

7. A process for the production of a one-piece, electrical circuit board comprising the steps of:

molding a first electrically insulating material into at least one first predetermined shape, the first electrically insulating material comprising a crystalline, high temperature, thermoplastic resin compound that is substantially free of catalyst for metallization by an electroless process and that is selected from the group consisting of polyesters, polyphenylene sulfide and polyetheretherketone, the first predetermined shape being capable of avoiding adherent metal deposition, the first predetermined shape including at least one surface area for forming an electrically nonconductive portion of the board, and a web portion being recessed relative to the surface area;

forming a second electrically insulating material into at least one second predetermined shape, said second shape being capable of adhesion promotion by an adhesion promotion process and the second electrically insulating material comprising an amorphous, high temperature thermoplastic resin compound that includes a catalyst treated filler for electroless metal deposition and that is selected from the group consisting of polysulfone, polyethersulfone, polyarylsulfone and polyetherimide;

interconnecting said first and second shapes to produce a one-piece, nonconductive article wherein the second material covers the web portion and forms a surface pattern corresponding to a predetermined conductive pattern of the electrical circuit board and selected surface areas of the article defined by said first shape(s) are unsuitable for adherent metallization and remaining areas defined by said second shape(s) are suitable for adherent metallization;

treating the one-piece, nonconductive article to adhesion promote the surface areas composed of the amorphous resin compound of the second shape; and electrolessly adding metal on the surface portion of the nonconductive article composed of the second shape by an additive process.

8. A process for the production of a one-piece electrical circuit board comprising the steps of:

forming a first electrically insulating material into a least one first predetermined shape, said first shape being treatable by a process to add metal thereto with strong adhesion, and the first electrically insulating material comprising an amorphous, high temperature thermoplastic resin compound that includes a catalyst treated filler for adherent electroless metallization and that is selected from the group consisting of polysulfone, polyethersulfone, polyarylsulfone and polyetherimide, the first predetermined shape including at least one surface area for forming electrically conductive paths of the board, and a web portion being recessed relative to the surface area;

molding a second insulating material into at least one predetermined second shape, said second shape comprising a crystalline, high temperature thermoplastic resin compound that is substantially free of catalyst for electroless metal deposition and that is selected from the group consisting of polyesters, polyphenylene sulfide and polyetheretherketone;

interconnecting said first and second shapes to produce a one-piece, nonconductive article wherein the second material covers the web portion and forms a surface pattern corresponding to electrically insulating portion of the surface of the electrical circuit board and selected surface areas of the article defined by said first shape(s) are suitable for adherent metallization and remaining areas defined by said second shape(s) are resistant for adherent metallization;

treating the one-piece, nonconductive article to adhesion promote the surface areas composed of the amorphous resin compound of the first shape, and electrolessly adding metal on the surface portions of the nonconductive article composed of the first shape by an additive process.

9. The process of claim 8 wherein said first material is formed by molding.

10. The process of claim 8 wherein said first material is molded by injection molding.

* * * * *